United States Patent
Saeki (10) Patent No.: US 7,800,918 B2
(45) Date of Patent: Sep. 21, 2010

(54) HIERARCHICAL MODULE

(75) Inventor: Takanori Saeki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 502 days.

(21) Appl. No.: 11/145,009

(22) Filed: Jun. 6, 2005

(65) Prior Publication Data
US 2005/0270875 A1 Dec. 8, 2005

(30) Foreign Application Priority Data
Jun. 7, 2004 (JP) .............................. 2004-168525

(51) Int. Cl.
H05K 1/11 (2006.01)
H05K 1/14 (2006.01)
(52) U.S. Cl. .................... 361/803; 361/760; 361/763
(58) Field of Classification Search ......... 361/760–763, 361/803; 365/52, 63
See application file for complete search history.

(56) References Cited

U.S. PATENT DOCUMENTS

| | | | |
|---|---|---|---|
| 5,870,350 A | 2/1999 | Bertin et al. | |
| 5,928,343 A | 7/1999 | Farmwald et al. | |
| 5,995,405 A | 11/1999 | Trick | |
| 6,034,878 A | 3/2000 | Osaka et al. | |
| 6,104,629 A * | 8/2000 | Wu .............................. | 365/63 |
| 6,297,663 B1 | 10/2001 | Matsuoka et al. | |
| 6,392,896 B1 * | 5/2002 | Stoller ........................ | 361/760 |
| 6,625,687 B1 | 9/2003 | Halbert et al. | |
| 6,879,526 B2 | 4/2005 | Lynch et al. | |
| 7,095,620 B2 * | 8/2006 | Bozso et al. ................ | 361/767 |
| 7,313,035 B2 | 12/2007 | Lynch et al. | |
| 7,411,806 B2 * | 8/2008 | Funaba et al. ................ | 365/63 |
| 2004/0085818 A1 | 5/2004 | Lynch et al. | |
| 2005/0128823 A1 | 6/2005 | Lynch et al. | |
| 2007/0237009 A1 | 10/2007 | Lynch et al. | |

FOREIGN PATENT DOCUMENTS

JP 6-348590 A 12/1994

(Continued)

OTHER PUBLICATIONS

Joseph Kennedy, et al., A 2Gb/s Point-to-Point Heterogeneous Voltage Capable DRAM Interface for Capacity-Scalable Memory Subsystems, 2004 IEEE International Solid-State Circuits Conference, ISSCC/SESSION 11/DRAM/11.8, pp. 214-215, Feb. 17, 2004.

(Continued)

Primary Examiner—Tuan T Dinh
(74) Attorney, Agent, or Firm—McGinn Intellectual Property Law Group, PLLC (57) ABSTRACT

There is provided a memory module that facilitates meeting the needs of high-speed performance and large capacity. It comprises first module substrates ($10_1$ through $10_8$), each with multiple DRAM devices (11), and a second module substrate whereon the first modules ($10_1$ through $10_8$) are mounted, signal line groups connected to the multiple first modules respectively are provided in parallel, and a controller LSI (50), connected to the multiple first modules respectively via the signal line groups provided in parallel, that converts the signal lines into fewer signal lines than the total number of the signal line groups and outputs the result is provided, and the second module substrate (20) is mounted on a motherboard (40).

20 Claims, 7 Drawing Sheets

FOREIGN PATENT DOCUMENTS

| | | |
|---|---|---|
| JP | 10-177427 A | 6/1998 |
| JP | 10-340224 | 12/1998 |
| JP | 11-219231 A | 8/1999 |
| JP | 2000-122761 A | 4/2000 |
| JP | 2006-505066 T | 2/2006 |
| KR | 2000-0008962 | 5/2000 |
| KR | 2000-0040734 | 7/2000 |
| TW | 526498 | 4/2003 |
| WO | WO 2004/042506 A2 | 5/2004 |

OTHER PUBLICATIONS

Korean Office Action dated Aug. 30, 2006, with partial English translation.

Japanese Office Action dated Feb. 23, 2010, with partial English translation.

* cited by examiner

HIERARCHICAL MODULE

FIELD OF THE INVENTION

The present invention relates to a memory module and especially to a hierarchical module architecture that facilitates coping with high-speed performance.

BACKGROUND OF THE INVENTION

A DIMM (Dual Inline Memory Module) has card edge connectors for transmitting and receiving electric signals externally where electric signals are assigned to the front and back of the board (one row each), and various kinds of products such as DDR (Double Data Rate), SDRAM (Synchronous DRAM), and 184-pin DIMM (400 MHz/256 MB) have been on the market. A DIMM is used for PCs and workstations, for instance, and mounted on the board perpendicularly using a DIMM socket.

Figure 5:
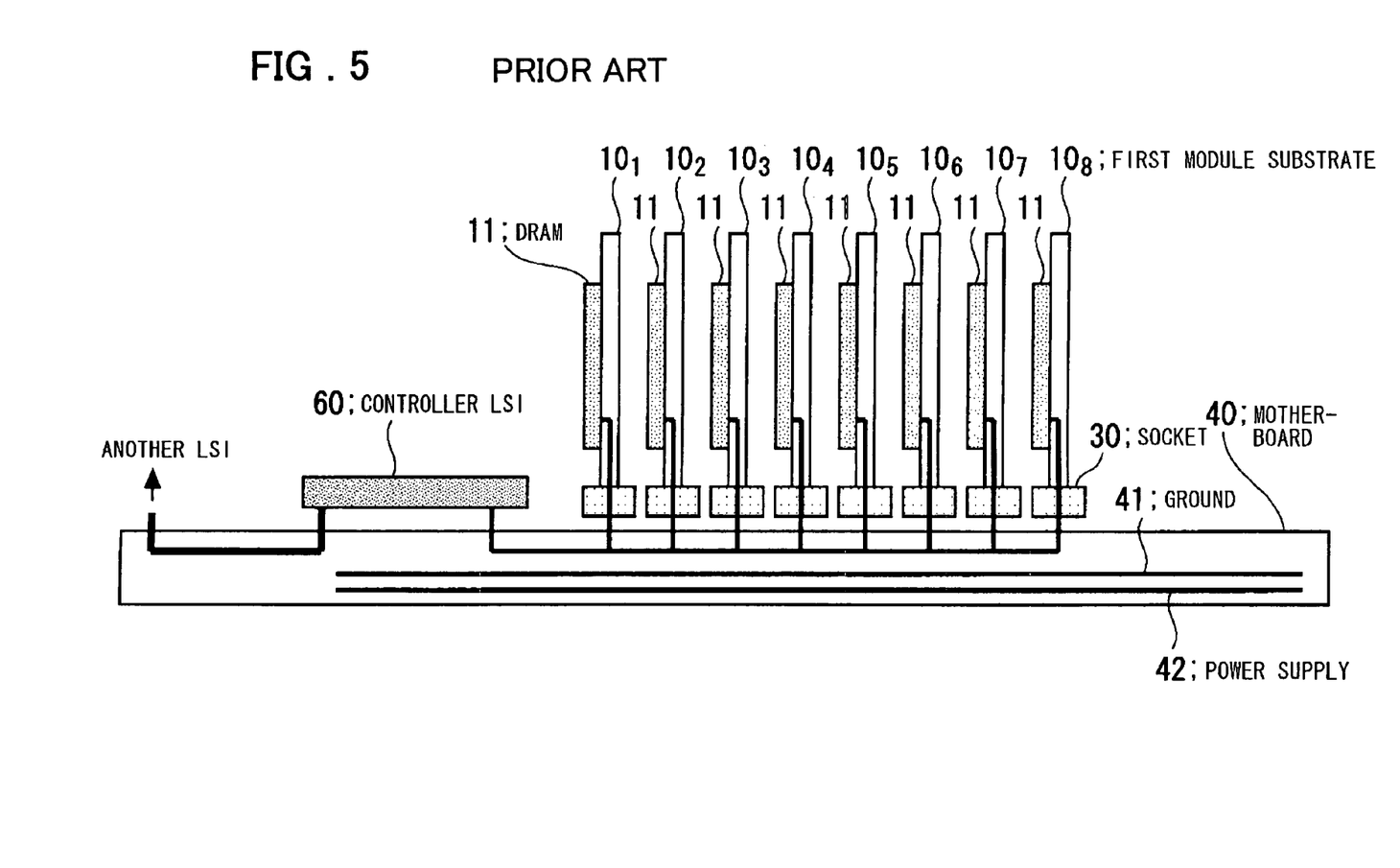
FIG. 5 shows memory modules of the conventional technology.

FIG. 5 is a drawing showing an example of the structure of a conventional memory module (multidrop system). In reference to FIG. 5, first module substrates 10, each of which has multiple DRAMs 11 (eight of them, for example), are inserted into sockets 30 soldered to a motherboard 40. In the example shown in FIG. 5, eight of the first module substrates 10 are mounted, and the eight first modules $10_1$ through $10_8$ are bus-connected and connected to a LSI 60 for controlling DRAM controllers. The controller LSI 60 is connected to a CPU, not shown in the drawing, on the motherboard 40. Hereinafter, the structure comprising the first module substrates 10 and the DRAMs 11 shown in FIG. 5 is called the first module. The first module corresponds to the above-mentioned DIMM. Further, the first module substrates $10_1$ through $10_8$ are referred to as the first module substrate 10 when a number is not specified.

In the case of the structure shown in FIG. 5, when the data transfer rate reaches high-speed, signal deterioration at the pins of the bus-connected first modules 10 becomes apparent. Furthermore, when the data transfer rate of each pin of the first modules 10 exceeds, for instance, 500 Mbps (megabits per second), no more than two first modules can be connected.

If a structure where multiple first modules are parallel-connected is employed as a countermeasure to the problem of the bus structure shown in FIG. 5, the numbers of the wiring lines and wiring layers on the motherboard and the wiring constraint increase. For instance, if eight of the first modules are parallel-connected, the motherboard will require not less than eight layers, resulting in a cost increase. Therefore, it is difficult to increase capacity.

Figure 6:
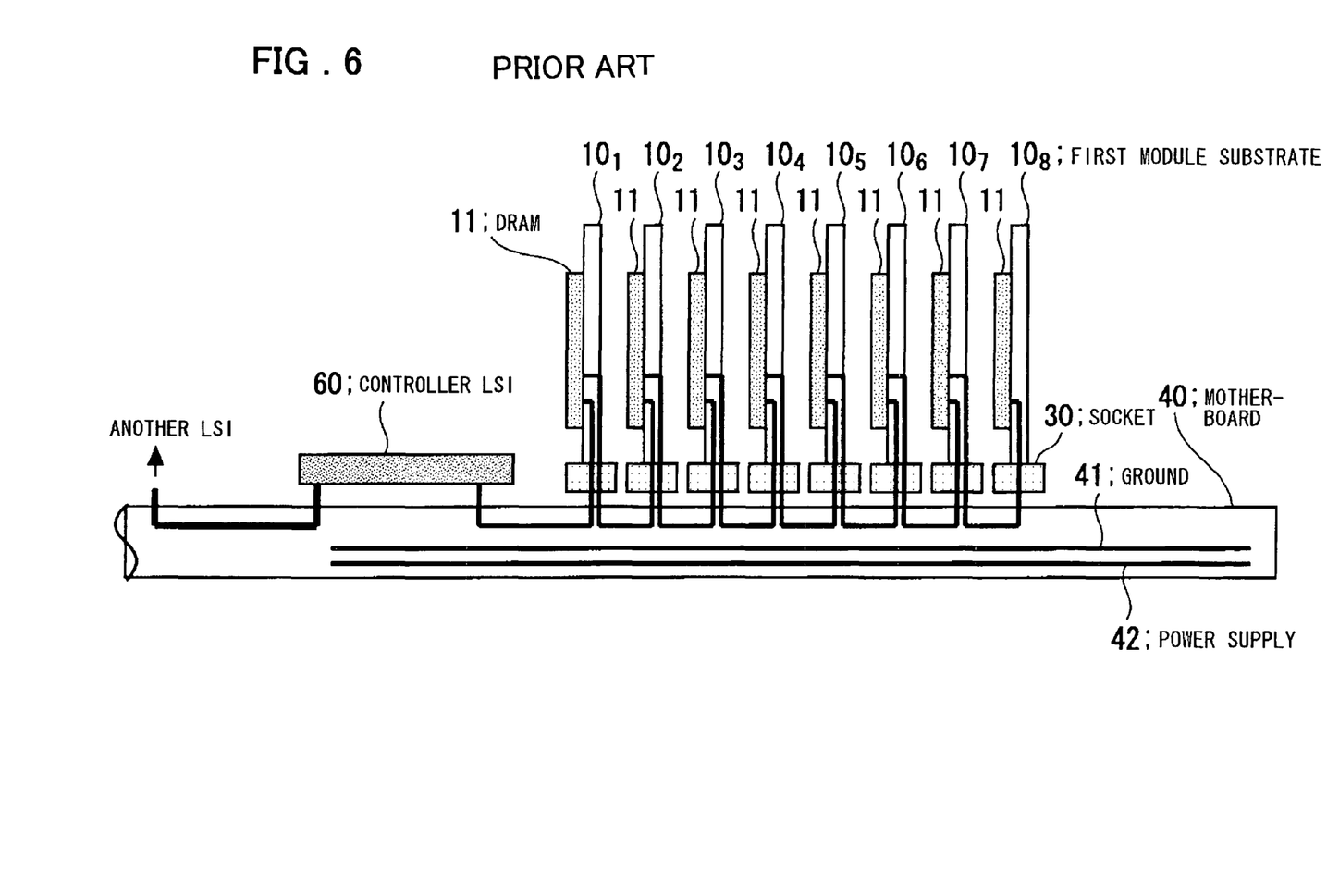
FIG. 6 shows memory modules of the conventional technology.

For instance, as means for reducing the number of the wiring lines on the motherboard, a structure where the first module substrates are cascade-connected (daisy chain method), shown in FIG. 6, is known. The data from the controller LSI 60 is transferred via the first module substrates one after another, and reaches its ultimate destination, the DRAM. Also, the output from the DRAM 11 of the rightmost first module substrate $10_8$ is inputted into the controller LSI 60 after passing through the first module substrates $10_7$ through $10_1$ one after another.

Furthermore, in order to reduce the number of the pins on the first module substrates and increase the data transfer speed, a technique of increasing the speed of the input/output of the DRAM by multiplexing it is also known. (Refer to Non-Patent Document 1, for example.) However, in the case of the above-mentioned technique where the input/output of the DRAM is multiplexed to increase its speed, for instance, in order for the data to pass through all the eight first module substrates $10_1$ to $10_8$, each first module substrate requires input/output pins. In this case, the actual overall data transfer speed is ½ at the first module compared to the data transfer speed of the interface of each module and the number of the pins on the first module since the input and output of the DRAM are multiplexed. Therefore, the test cost for the interface of the first module is doubled. (For example, the test time is doubled.)

Further, in the structure shown in FIG. 6, the more the number of the cascade-connected first module substrates 10 increases, the more the data transfer rate per interface decreases, divided by the number of the cascade-connected module substrates.

For instance, in the case where the first modules have:
  10 incoming send/receive channels (send: 2 pins/1 channel, receive: 2 pins/1 channel, a total of 40 pins)
  10 outgoing send/receive channels (send: 2 pins/1 channel, receive: 2 pins/1 channel, a total of 40 pins)
  a data rate of 2 Gbps per channel
  Eight modules connected
The overall number of the high-speed interfaces is (10+10)×8=160 send/receive channels, and the overall data transfer speed is 10×2=20 Gbps.

Furthermore, in the case of the structure shown in FIG. 6, since it is a daisy-chain connection system, the bigger the number of the first modules connected is, the more the latency increases.

Further, a structure where a controller multiplexes the data of multiple SDRAMs and outputs it to a data I/O bus, and an address and data from a processor are demultiplexed and supplied to the SDRAM is described in Patent Document 1.

[Patent Document 1]
  Japanese Patent Kokai Publication JP-A-10-340224 (FIGS. 1 and 5) (corresponding U.S. Pat. No. 5,870,350A)

[Non-Patent Document 1]
  Joseph Kennedy et al., "A 2 Gb/s Point-to-Point Heterogeneous Voltage Capable DRAM Interface for Capacity-Scalable Memory Subsystems," IEEE International Solid-State Circuits Conference ISSCC/SESSION 11/DRAM/11.8, pp. 214-215, February 2004.

The entire disclosures of Patent Document 1 and Non-Patent Document 1 are incorporated herein by reference thereto.

SUMMARY OF THE DISCLOSURE

Therefore, there is much desired in the art for a module architecture that realizes a system where it is possible to parallel-dispose multiple modules, increase the transfer rate speed, and handle large capacity.

Further, there is also desired in the art for a module architecture that achieves the above-mentioned objects without a big cost increase, and an apparatus comprising the same.

According to the present invention disclosed in the present application, the specific aspects of the invention include as follows:

A module relating to an aspect of the present invention comprises multiple first modules having substrates with at least one memory device, and a second module whereon the multiple first modules are mounted. The second module comprises: a substrate with at least two pairs of signal line groups arranged in parallel and connected to at least two first modules of the multiple first modules respectively. The second module further comprises a controller, provided on the substrate, and connected to at least two pairs of the signal line groups arranged in parallel, that converts the signal lines into fewer lines than the total number of at least two pairs of the signal line groups.

In the module relating to the present invention, the substrate of the second module is mounted on the second module, and has signal wiring layers not fewer than the total number of the pairs of the signal line groups of the first modules arranged in parallel to each other.

In the module relating to the present invention, the multiple first modules are connected in common to bus lines provided on the substrate of the second module, and are connected to the corresponding terminals of the controller via the bus lines. In the present invention, a structure where multiple pairs of the bus lines are arranged in parallel on the substrate of the second module can be employed. In the present invention, a structure where the multiple first modules are divided into multiple groups and multiple first modules in the same group are connected to the common bus lines provided on the second module substrate and to the controller can be employed.

In the present invention, a structure where the controller multiplexes the output of the multiple first modules connected in parallel and outputs the result can be employed.

In the present invention, the substrate that constitutes the second module has a layer structure where power supply layers and ground layers, which comprise the substrate, are provided alternately. The power supply layer, an insulating layer (resin), and the ground layer can be used as a decoupling capacitance.

In the present invention, a structure where the controller is disposed on the back side of the second module substrate and underneath the first modules can be employed.

In the present invention, the second module substrate is preferably mounted on the motherboard.

In the present invention, the memory device is comprised of a DRAM device, the first modules are DIMMs, and the controller is comprised of a DRAM controller.

An apparatus relating to another aspect of the present invention comprises multiple first modules having first substrates on which at least one semiconductor device is provided, a second module having a second substrate on which the multiple first modules are provided and at least two of the multiple first modules are arranged in parallel, and a third substrate on which the second module is mounted. In the apparatus relating to the present invention, at least two pairs of signal line groups connected to at least two of the multiple first modules respectively are preferably provided in parallel on the second substrate of the second module, and a controller device that is connected to at least two pairs of the signal line groups arranged in parallel and that converts the number of signal lines into a number smaller than the total number of at least two pairs of the signal line groups is provided on the second substrate.

The meritorious effects of the present invention are summarized as follows.

According to the present invention, a system with a high-speed transfer rate and large capacity can be realized by employing the hierarchical module architecture comprising the second module that facilitates an optimum wiring between the first modules and the controller circuit.

According to the present invention, the difficulty in wiring design of the motherboard 40 is eliminated by employing the structure where the first modules are mounted on the second module and not directly on the motherboard.

According to the present invention, the data transfer speed of each pin can be improved greatly by employing the hierarchical module architecture, and the test cost, development cost, and power consumption of the pins at the same data rate can be reduced.

According to the present invention, even when the number of the modules connected is increased, the increase in latency can be restrained.

PREFERRED EMBODIMENTS OF THE INVENTION

The preferred embodiments of the present invention will be described further in detail with reference to the attached drawings. An embodiment of the present invention, in reference to FIGS. 1 and 1A, comprises multiple first modules ($10_1$ to $10_8$) that include substrates (10) with multiple semiconductor devices (such as DRAMs 11), and a second module substrate (20) whereon the multiple first modules ($10_1$ to $10_8$) are mounted, at least two pairs of signal line groups (23) are disposed in parallel and connected to at least two first modules of the multiple first module ($10_1$ to $10_8$) respectively, a controller (such as a controller LSI 50), connected to at least two first modules through at least two pairs of the signal line groups disposed in parallel respectively, that converts the number of the signal lines into a number smaller than the total number of at least two pairs of the signal line groups is provided. This second module substrate has wiring layers not fewer than the number of the signal line group of the first modules disposed in parallel (for instance, when four pairs of the signal line group of the first modules are disposed in parallel, the second module substrate has not fewer than four layers of signal wiring layers). The second module substrate (20) is mounted on a motherboard (40) for example. The second module substrate (20) is newly introduced by the present invention and by employing a hierarchical module architecture comprised of multiple first modules and the second module on which the first modules are mounted, multiple first modules can be connected in parallel without redesigning the motherboard, and the needs of high-speed transfer and test cost reduction can be met while simplifying the structure. Hereinafter, embodiments will be described.

Embodiment

Figure 1:
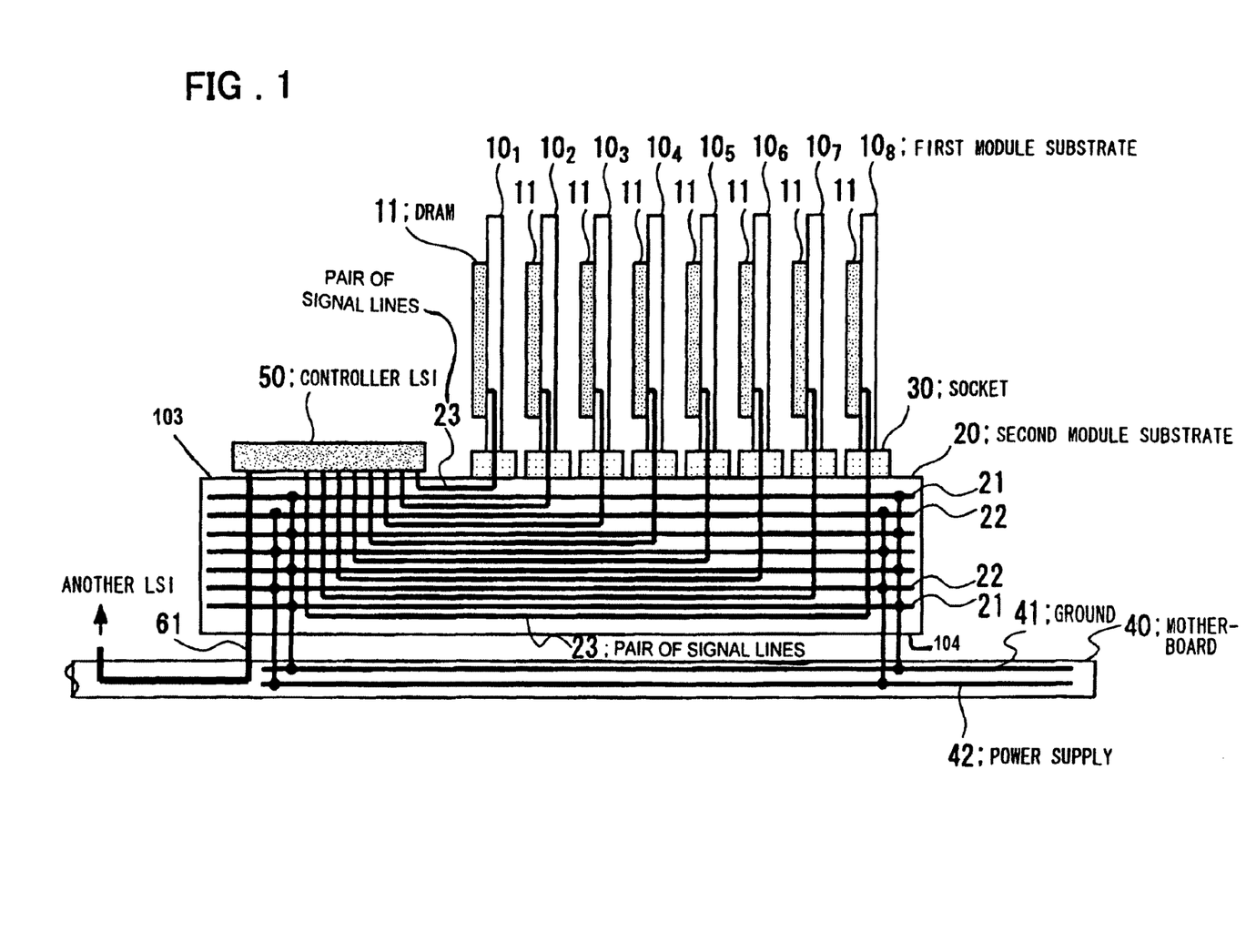
FIGS. 1 and 1A show the structure of the first embodiment according to the present invention.
Figure 1A:
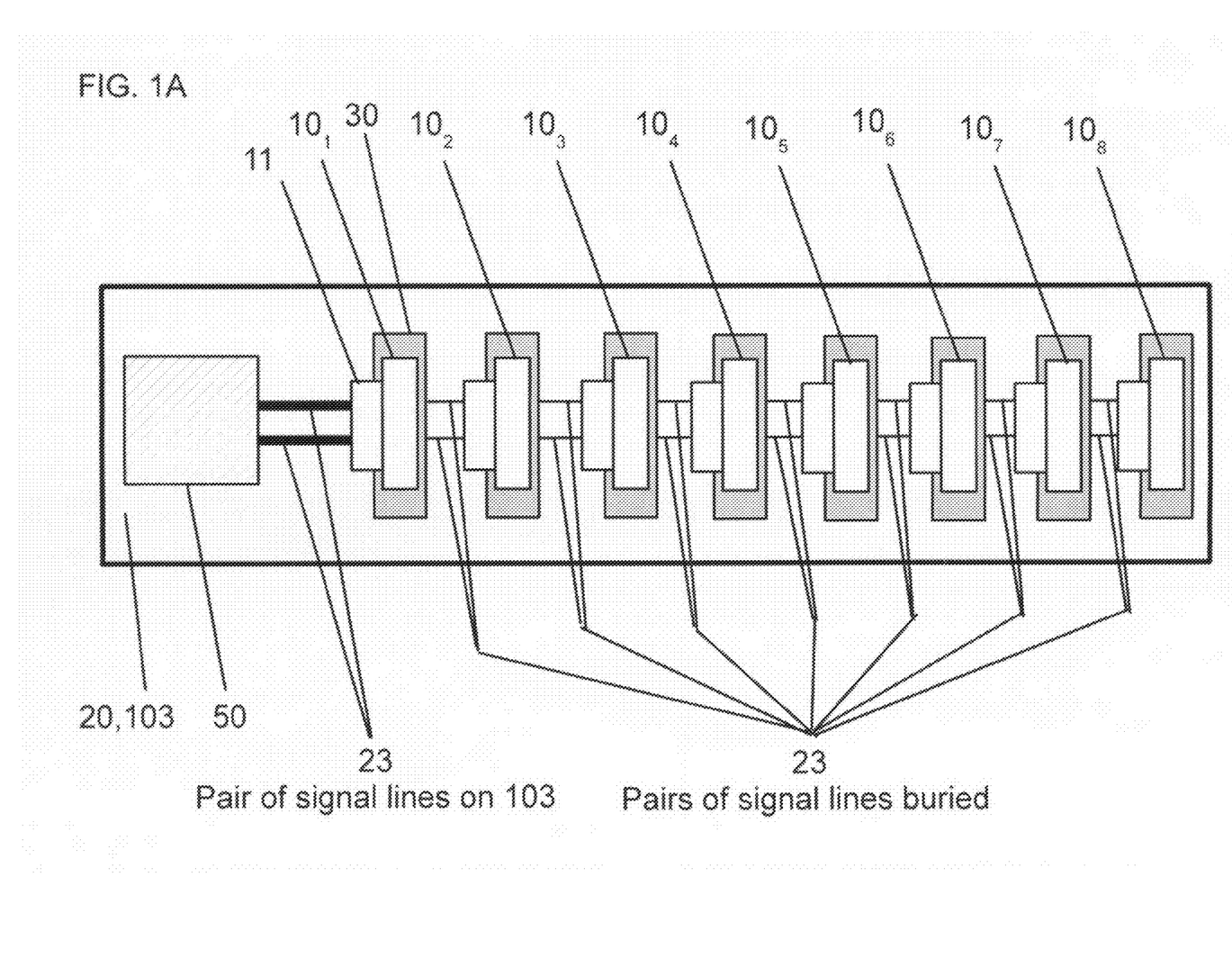

FIGS. 1 and 1A are drawings showing the structure of a first embodiment of the present invention. In reference to FIGS. 1 and 1A, in the first embodiment of the present invention, the first module substrates 10 with the DRAMs 11 has the same structure (DIMM) as the first module substrates 10 described with reference to FIGS. 5 and 6, the first module substrates 10 are inserted into sockets 30 and mounted on the second module substrate 20. The sockets 30 are soldered and fixedly connected to the second module substrate 20. The second module substrate 20 is connected on the motherboard 40 by soldering, for example.

In the present embodiment, the controller LSI 50 such as a DRAM controller is mounted on the second module substrate 20 as well, and the sockets 30, into which each of the eight first module substrates $10_1$ to $10_8$ are inserted, and the corresponding pins (electrodes) of the controller LSI 50 are connected in parallel to each other by the pairs of wiring lines (signal lines) 23 provided in the second module substrate 20. In the present embodiment, eight pairs of the signal lines (23) connected to the first modules $10_1$ to $10_8$ are provided in parallel in a different layer.

In the present embodiment, the second module substrate 20 has signal wiring layers not fewer than the number of the signal line group of the first modules disposed in parallel. The first module substrate $10_1$ near the end of the controller LSI 50 is connected to the corresponding pin (electrode) of the controller LSI 50 by the wiring line pair 23 in the component side signal layer 103 (or a layer beneath it) on the surface of the second module substrate. The first module substrate $10_8$, furthest from the controller LSI 50, is connected to the corresponding pin (electrode) of the controller LSI 50 by the wiring line pair 23 in the solder side signal layer 104 (or a layer above it) on the back side. The number of the signal wiring layers of the second module substrate 20 is not fewer than eight layers, corresponding to the number (eight) of the signal line groups of the multiple first modules provided in parallel.

Further, a second layer is a ground layer 21, and then a power supply layer 22 and the ground layer 21 are provided alternately, providing a countermeasure against the noise of high-speed signal transmission. Further, the power supply layer 22 and the ground layer 21 can be used as a decoupling capacitance (capacitance corresponding to a frequency band) with these layers as capacitive electrodes (an insulating resin interposed between the power supply layer 22 and the ground layer 21 is the capacitance).

The controller LSI 50 performs input/output operations to and from the first module substrates 101 to 108 in parallel through the eight pairs of the wiring lines (signal lines) 23 (the multilayer wiring within the second module substrate 20).

Further, the controller LSI 50, for instance, is connected to a CPU (another LSI) provided on the motherboard 40 and not shown in the drawing via a signal line 61. The controller LSI 50 converts the number of the signal line 61 (data line for example) into a number smaller than the eight pairs of the signal lines 23.

According to the present embodiment, an optimum wiring between the first modules and the controller LSI 50 is achieved by employing the hierarchical module architecture where the second module 20 with the first modules and the controller LSI 50 is provided and mounted on the motherboard 40.

Further, even when the transfer rate of the DRAM 11 is, for instance, several hundred MHz (660 MHz, for example), the data transfer rate of the second module substrate 20 with the multiple first modules is the same rate as the transfer rate of the DRAM 11, and it does not have to be several GHz. Only the controller LSI 50 requires a high-speed interface. This facilitates the realization of a system with large capacity and a high-speed transfer rate (such as a server).

According to the present embodiment, the difficulty in wiring design of the motherboard 40 is eliminated by employing the structure where the first modules are mounted on the second module substrate 20 and not directly on the motherboard 40. When the number of the first modules provided in parallel is increased, the number of the wiring layers of the second module substrate 20 increases while the structure of the motherboard 40 remain the same. In other words, in the present embodiment, the structure of the motherboard is independent of the number of the first modules provided in parallel.

Further, according to the present embodiment, the data transfer speed of each pin of the first modules can be improved greatly by employing the hierarchical module architecture, and the test cost, development cost, and power consumption of the pins at the same data rate can be reduced.

Further, even when the number of the first modules connected is increased, the increase in latency can be restrained.

Also, according to the present embodiment, the second modules substrate 20 has a layer structure in which the power supply layer 22 and the ground layer 21 are provided consecutively, giving a countermeasure against the noise of high-speed signal transmission.

Further, the controller LSI 50 can have a structure where signals are serial-transmitted between the LSI 50 and another LSI via the signal line 61, or a structure where signals are parallel-transmitted between the LSI 50 and another LSI by one pair of the signal lines (m lines) of the first module substrates 10 or even fewer signal lines.

Figure 2:
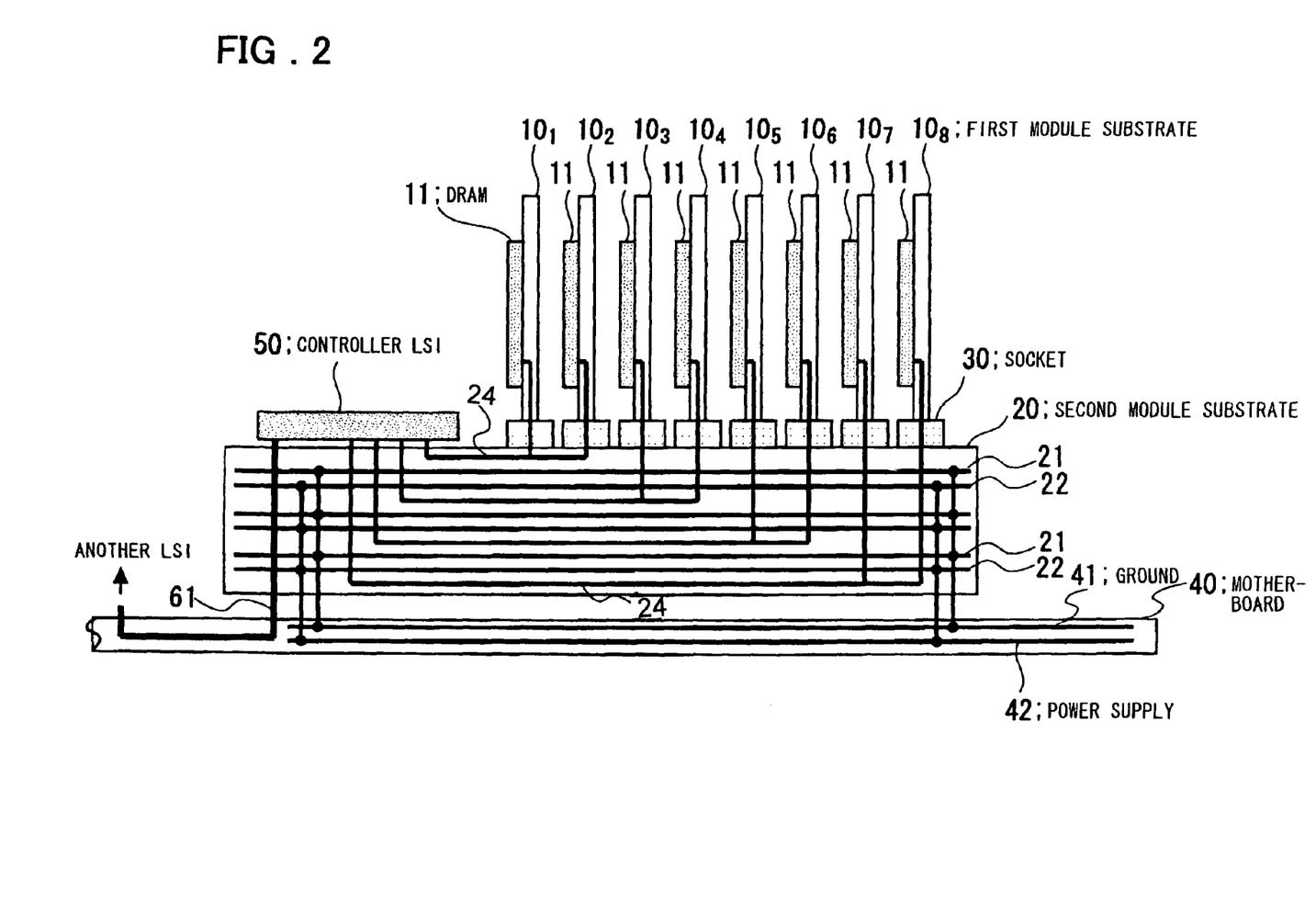
FIG. 2 shows the structure of the second embodiment according to the present invention.

Next, a second embodiment of the present invention will be described. FIG. 2 is a drawing showing the structure of the second embodiment of the present invention. In the second embodiment of the present invention, multiple first module substrates are connected to a common bus line by group. In other words, in reference to FIG. 2, first module substrates $10_1$ and $10_2$, nearest to a controller LSI 50, are connected to the corresponding pins (electrodes) of the controller LSI 50 by a bus (wiring) 24 in the component side signal layer on the surface (or a layer beneath it) of a second module substrate 20, module substrates $10_3$ and $10_4$ are connected to the corresponding pins (electrodes) of the controller LSI 50 by the bus (wiring) 24 across a ground layer 21 and power supply layer 22, module substrates $10_5$ and $10_6$ are connected to the corresponding pins (electrodes) of the controller LSI 50 by the bus (wiring) 24 across the ground layer 21 and power supply layer 22, module substrates $10_7$ and $10_8$, furthest from the controller LSI 50, are connected to the corresponding pins (electrodes) of the controller LSI 50 by the bus (wiring) 24 in the solder side signal layer (or a layer above it) on the back side of the second module substrate 20. The power supply layers 22 and the ground layers 21 are provided alternately in this embodiment as well, providing a countermeasure against the noise of high-speed signal transmission.

In the second embodiment of the present invention, multiple first modules are connected in parallel by group (in FIG. 2, two neighboring first modules consist of a group and four groups are connected in parallel), first modules in the same group are bus-connected to a common bus line.

According to the second embodiment of the present invention, the number of the wiring layers of the second module substrate 20 can be fewer than the above-mentioned first embodiment, and by employing a structure where two module substrates are bus-connected to accommodate to high-speed transfer, the need for high-speed transfer rate can be met.

Figure 3A:
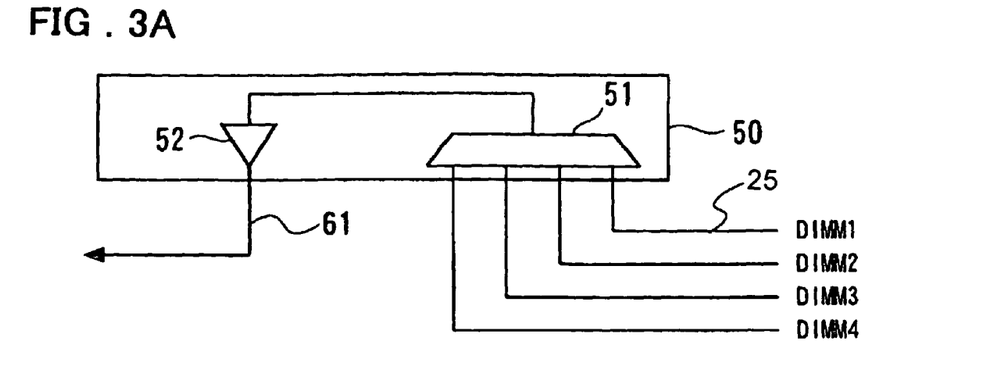
FIGS. 3A, 3B and 3C show the structure of the controller LSI according to the present invention.
Figure 3B:
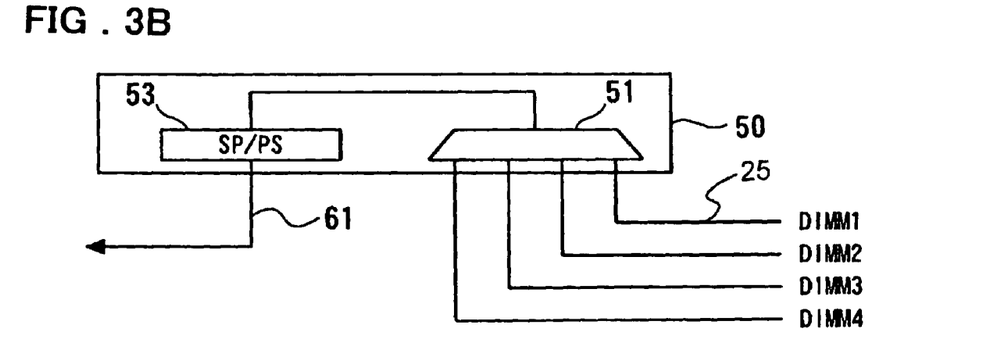
Figure 3C:
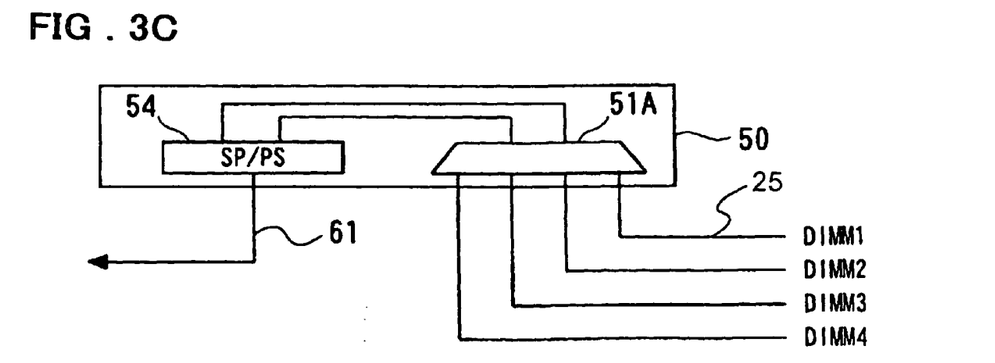

FIGS. 3A through 3C are drawings showing a few examples of the structure of the controller LSI 50. In FIGS. 3A through 3C, the first modules shown in FIGS. 1, 1A, and 2 are assumed to be DIMMs, and for the sake of simplicity, the second module substrate 20 is considered to have four (DIMM 1 to DIMM 4) first modules connected in parallel.

In reference to FIG. 3A, this controller LSI 50, with a selection circuit 51, selects one output from the outputs of the four first modules (DIMM1 to DIMM4) and outputs it. For instance, a first module outputs m number of wiring lines (signal lines) 25 to the controller LSI 50, and the controller LSI 50 selects an output from the outputs of the four sets of the first modules (DIMM1 to DIMM4), outputs it to the signal lines 61 (m lines) from a buffer circuit 52, and transfers it to a CPU, not shown in the drawing. Also, the selection circuit 51 supplies a signal from the CPU (not shown in the drawing) to the corresponding first module (DIMM1 to DIMM4). In this case, the transfer rate of the signal line 61 of the controller LSI is the same as the transfer rate of the signal line 25. Or a structure where the selection circuit 51 is a multiplexer circuit and the signals from the four modules (DIMM1 to DIMM4) are multiplexed and outputted from the buffer can be employed. In FIG. 3A, the buffer circuit 52 is comprised of a tristate buffer circuit and receiver circuit, and can have a circuit structure where input/output is multiplexed or an I/O separate structure where input pins and output pins are separate.

FIG. 3B is a drawing showing another example of the structure of the controller LSI 50. In reference to FIG. 3B, in this controller LSI 50, the selection circuit 51 that receives multiple pairs of the signal lines 25 (m lines per pair) from the four modules (DIMM1 to DIMM4) selects one pair, which is serial-converted by a parallel/serial conversion circuit of an SP (serial-parallel)/PS (parallel-serial) circuit 53 and transferred to a CPU, not shown in the drawing. Meanwhile, a serial/parallel conversion circuit of the SP/PS circuit 53 converts a serial signal from the CPU into a parallel signal, and the selection circuit 51 supplies it to the signal line 25 of the corresponding first module. The parallel/serial conversion circuit of the SP/PS circuit 53 can have a structure where it performs a conversion of, for instance, n:1 (n is a measure of m and not smaller than 2) and converts a pair of the signal lines 25 (m lines) selected by the selection circuit 51 into m/n number of the signal lines 61. In this case, signals of the wiring lines 61 is driven by a higher frequency than that of the signal line 25, however, the transfer rates of the signal lines 25 of the DIMM1 through DIMM4 connected in parallel are the same as the transfer rate of the DRAM.

FIG. 3C is a drawing showing a different example of the structure of the controller LSI 50. In reference to FIG. 3C, in this controller LSI 50, a selection circuit 51A that receives multiple pairs of the signal lines 25 (m lines per pair) from the four modules (DIMM1 to DIMM4) selects two pairs of the signal lines (2×m lines) simultaneously, a parallel/serial conversion circuit of a SP/PS circuit 54 serial-converts each of the two pairs of the signal lines and transfers the result to a CPU, not shown in the drawing. Also, a serial/parallel conversion circuit of the SP/PS circuit 54 converts serial signals from the CPU not shown in the drawing into two pairs of parallel signals, and the selection circuit 51A, which receives the two pairs of parallel signals, supplies these two pairs of parallel signals to the signal lines 25 of the corresponding two pairs of the first modules in parallel. The parallel/serial conversion circuit of the SP/PS circuit 54 can have a structure where it performs a conversion of, for instance, n:1, and converts m×2 number of the signal lines of two DIMMs, selected by the selection circuit 51A, into (m/n)×2 number of the signal lines. In this case, the driving frequency of signals on the wiring line 61 is twice as much as that in the case shown in FIG. 3B. Further, the transfer rates of the signal lines 25 of the DIMM1 through DIMM4 connected in parallel are the same as the transfer rate of the DRAM.

Figure 4:
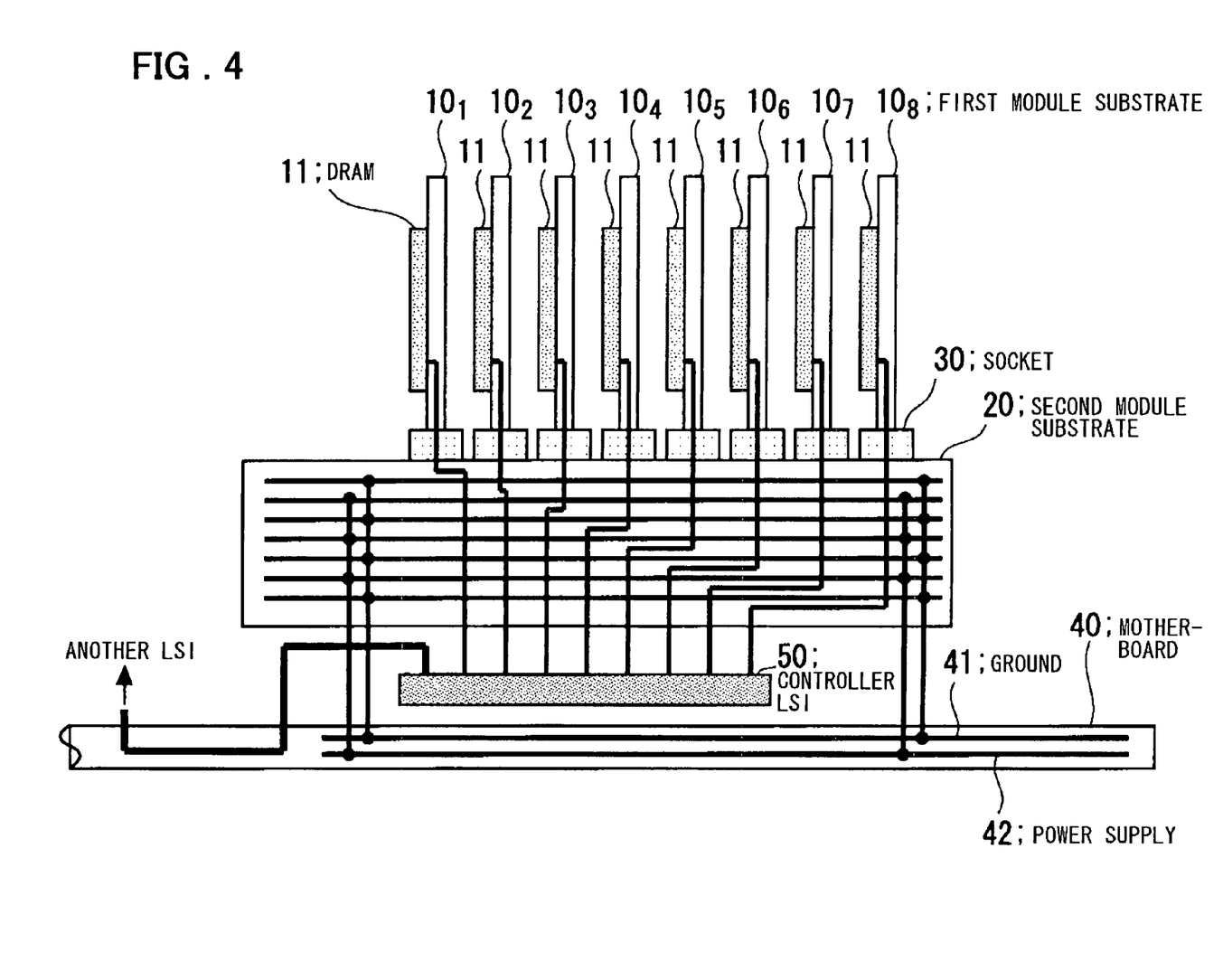
FIG. 4 shows the structure of the third embodiment according to the present invention.

Next, another embodiment of the present invention will be described. FIG. 4 is a drawing showing a third embodiment of the present invention. In reference to FIG. 4, in the present embodiment, the controller LSI 50 is disposed in an area corresponding to the location of the first module substrates 10 of the back side of the second module substrate 20. Preferably, the controller LSI 50 should be disposed right beneath the location of the first module substrates 10 of the back side of the second module substrate 20, reducing the area of the second module substrate to approximately the same as the area where the first modules are arranged. The second module substrate 20 is fixed to the motherboard 40 by a fixing tool such as a spacer.

According to the present embodiment, the area of the second module substrate 20 can be reduced, improving mounting density and flexibility in design.

As described above, according to the present invention, even in the case where a high-speed interface is used as the controller LSI, the total number of high-speed interfaces is as follows: 10 channels (send only) in the incoming route (the route toward the CPU) and 10 channels (receive only) in the outgoing route (the route from the CPU to the DRAM). The overall data transfer speed is 10×2=20 Gbps, the same as that of the conventional technology.

Therefore, according to the present invention, the data speed per high-speed interface channel is sixteen times as fast as that of the conventional structure shown in FIG. 6.

Further, in the present invention, if the first modules connected in parallel are multiplexed (for instance, two modules are multiplexed), the total number of high-speed interfaces will be as follows: 20 channels in the incoming route (send only) and 20 channels in the outgoing route (receive only). The data transfer rate per channel will be 2 Gbps, and the overall data transfer speed will be 10×4=40 Gbps. This is twice as much as that of the conventional structure shown in FIG. 6. However, as far as the number of high-speed interface channels is concerned, only one-eighth will be necessary since the data transfer speed is sixteen times as fast.

Therefore, the present invention can greatly reduce the test cost, development cost, and power consumption of the high-speed pins at the same data rate.

Comparisons among the conventional technology, the present invention, and present invention (when the parallel modules are multiplexed by the controller LSI) are shown in the table below.

TABLE 1

|  | Conventional Technology | Present Invention | Present Invention (when the parallel modules are multiplexed by the controller LSI) |
|---|---|---|---|
| Total Number of Interfaces with 8 Modules | Send 160 Receive 160 | Send 10 Receive 10 | Send 20 Receive 20 |
| Overall Data Transfer Speed | 20 Gbps | 20 Gbps | 40 Gbps |
| High-speed Pin Test Cost (against Conventional Technology | 1 | 1/16 | 1/8 |
| High-speed Pin Power Consumption (against Conventional Technology) | 1 | 1/16 | 1/8 |

The hierarchical module architecture according to the present invention is most suitable when used for a high-speed memory module of a server with a high-speed CPU, however, it can also be used for other data and information processing apparatuses. Furthermore, in the above-described embodiments, the DIMMs are inserted into the board perpendicularly, however, the present invention is not limited to such a structure.

The present invention is described above with reference to the above-mentioned embodiments, however, the present invention is not limited to the structures of the above embodiments, and it should be noted that it includes various modifications and revisions, which may be made possible by a manufacturer within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A hierarchical module comprising:
   a plurality of first modules, each of said first modules comprising a first module substrate on which at least one semiconductor device is provided;
   a second module substrate on which said first modules are mounted, said second module substrate comprising a plurality of wiring layers;
   a third substrate on which said second module substrate is mounted;
   a controller device provided on said second module substrate; and
   a plurality of pairs of signal lines, each of said pairs of signal lines being provided in parallel and connecting one of said first modules with said controller device through one of said wiring layers of said second module substrate,
   wherein at least two of said of signal lines connect said controller device with at least two of said first modules respectively,
   wherein a number of said wiring layers is not less than a number of the pairs of signal lines,
   wherein said controller device converts a signal provided by a data line into a signal for a pair of signal lines in said plurality of pairs of signal lines, and
   wherein said controller device converts a signal provided by a pair of signal lines in said plurality of pairs of signal lines into a signal for said data line.

2. The hierarchical module as defined in claim 1, wherein said controller device comprises a circuit that selects said pair of signal lines in said plurality of pairs of signal lines connected to said first modules respectively.

3. The hierarchical module as defined in claim 1, wherein said controller device comprises a circuit that supplies a signal inputted into said controller device from a data line supplying a plurality of signals to said first modules to corresponding pairs of signal lines in said plurality of pairs of signal lines connected to said first modules for which said signal was intended.

4. The hierarchical module as defined in claim 1, wherein said controller device comprises a circuit that receives signals from at least said pair of signal lines in said plurality of pairs of signal lines connected to said first modules respectively, multiplexes the signals, and outputs the signals to a data line.

5. The hierarchical module as defined in claim 1, wherein said controller device comprises a circuit that receives multiplexed signals inputted into said controller device through a data line supplying a plurality of signals to said first modules, demultiplexes said multiplexed signals, and supplies said demultiplexed multiplexed signals to corresponding pairs of signal lines in said plurality of pairs of signal lines connected to said first modules for which said multiplexed signals were intended.

6. The hierarchical module as defined in claim 1, wherein the wiring layers comprise a layer structure where a plurality of power supply layers and a plurality of ground layer are provided alternately.

7. The hierarchical module as defined in claim 1, wherein said controller device is provided on a side of said second module substrate where said first modules are provided.

8. The hierarchical module as defined in claim 1, wherein said controller device is provided on a side of said second module substrate opposite to a side where said first modules are provided.

9. The hierarchical module as defined in claim 1, wherein said third substrate comprises a motherboard.

10. The hierarchical module as defined in claim 1, further comprising:
    multiple sockets in which said first modules are inserted for mounting on said second module substrate, said multiple sockets formed on said second module substrate.

11. The hierarchical module as defined in claim 1, wherein said controller device is formed in an area corresponding to a location of said first modules at a back side of said second module substrate.

12. The hierarchical module as defined in claim 1, wherein said wiring layers comprise a plurality of power supply layers and a plurality of ground layers provided alternately, and
    wherein said plurality of pairs of signal lines are arranged in said alternately provided power supply layers and ground layers.

13. The hierarchical module as defined in claim 1, wherein said plurality of wiring layers comprise:
    a component side wiring layer provided as an uppermost layer of said second module substrate;
    a solder side wiring layer provided as a bottommost layer of said second module substrate; and
    a plurality of ground and power supply layers provided alternately between said component side wiring layer and said solder side wiring layer.

14. The hierarchical module as defined in claim 1, wherein said controller device comprises a serial-parallel/parallel-serial (SP/PS) circuit that converts said signal provided by said data line into said signal for said pair of signal lines in said plurality of pairs of signal lines and converts said signal provided by said pair of signal lines in said plurality of pairs of signal lines into said signal for said data line.

15. The hierarchical module as defined in claim 6, wherein the layer structure comprises one of the power supply layers, an insulating layer, and one of the ground layers, and is used as a decoupling capacitance on said second module substrate.

16. The hierarchical module as defined in claim 9, wherein said at least one semiconductor device comprises a dynamic random access memory (DRAM) device,
    wherein said first modules comprise dual inline memory modules (DIMM), and wherein said controller device comprises a DRAM controller.

17. The hierarchical module as defined in claim 11, wherein said controller device is formed beneath the location of said first modules at said back side of said second module substrate.

18. The hierarchical module as defined in claim 14, wherein said signal provided by said data line and said signal for said data line comprise a serial signal, and wherein said signal for said pair of signal lines in said plurality of pairs of signal lines and said signal provided by said pair of signal lines in said plurality of pairs of signal lines comprise a parallel signal.

19. An electronic device comprising the hierarchical module as defined in claim 16.

20. A hierarchical module, comprising:

a plurality of first module substrates formed on a second module substrate, said second module substrate being formed on a motherboard and comprising a plurality of wiring layers;

a plurality of semiconductor devices formed on said first module substrates;

a controller formed on said second module substrate; and a plurality of pairs of parallel signal lines connecting said controller with said semiconductor devices through said wiring layers and said first module substrates wherein at least two pairs of signal lines of said plurality of pairs of signal lines connect said controller with at least two of said semiconductor devices through at least two of said wiring layers and at least of two of said first module substrates, respectively, wherein an amount of said wiring layers is not less than an amount of the plurality of pairs of signal lines, wherein said controller device converts a signal provided by a data line into a signal for a pair of signal lines in said plurality of pairs of signal lines, and wherein said controller device converts a signal provided by a pair of signal lines in said plurality of pairs of signal lines into a signal for said data line.

* * * * *